(12) United States Patent
Carlson et al.

(10) Patent No.: US 10,453,829 B2
(45) Date of Patent: Oct. 22, 2019

(54) METHOD AND APPARATUS FOR REDUCING CAPACITANCE OF INPUT/OUTPUT PINS OF MEMORY DEVICE

(71) Applicant: Intel Corporation, Santa Clara, CA (US)

(72) Inventors: Merri Lyn Carlson, Boise, ID (US); Hongbin Zhu, Boise, ID (US); Gordon A. Haller, Boise, ID (US); James E. Davis, Meridian, ID (US); Kevin G. Duesman, Boise, ID (US); James Mathew, Boise, ID (US); Michael P. Violette, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/625,350

(22) Filed: Jun. 16, 2017

(65) Prior Publication Data

US 2018/0366453 A1 Dec. 20, 2018

(51) Int. Cl.
| | |
|---|---|
| *H01L 27/11556* | (2017.01) |
| *H01L 25/10* | (2006.01) |
| *H01L 27/11529* | (2017.01) |
| *H01L 27/11548* | (2017.01) |

(52) U.S. Cl.
CPC ...... *H01L 25/105* (2013.01); *H01L 27/11529* (2013.01); *H01L 27/11548* (2013.01); *H01L 27/11556* (2013.01)

(58) Field of Classification Search
CPC ......... H01L 27/11526; H01L 27/11531; H01L 27/11551–11556; H01L 27/11573; H01L 27/11578–11582
See application file for complete search history.

(56) References Cited

U.S. PATENT DOCUMENTS

| | | | | |
|---|---|---|---|---|
| 2011/0220987 | A1* | 9/2011 | Tanaka | H01L 27/11578 257/324 |
| 2012/0139127 | A1* | 6/2012 | Beyne | H01L 21/764 257/774 |
| 2013/0130468 | A1* | 5/2013 | Higashitani | H01L 29/7926 438/382 |
| 2013/0130495 | A1* | 5/2013 | Higashitani | H01L 27/11565 438/630 |
| 2013/0270625 | A1* | 10/2013 | Jang | H01L 29/7926 257/324 |
| 2014/0061751 | A1* | 3/2014 | Nakajima | H01L 27/088 257/314 |
| 2014/0061766 | A1* | 3/2014 | Kito | H01L 27/11565 257/324 |
| 2015/0028410 | A1* | 1/2015 | Kato | H01L 29/792 257/324 |
| 2015/0041988 | A1* | 2/2015 | Uzoh | H01L 21/76802 257/774 |

(Continued)

*Primary Examiner* — Bryan R Junge
(74) *Attorney, Agent, or Firm* — Alliance IP, LLC

(57) ABSTRACT

In one embodiment, an apparatus comprises a tier comprising alternating first and second layers, wherein the first layers comprise a first conductive material and the second layers comprise a first dielectric material; a lower metal layer below the tier; a bond pad above the tier, the bond pad coupled to the lower metal layer by a via extending through the tier; and a first channel formed through a portion of the tier, the first channel surrounding the via, the first channel comprising a second dielectric material.

22 Claims, 11 Drawing Sheets

(56) References Cited

U.S. PATENT DOCUMENTS

| | | | |
|---|---|---|---|
| 2015/0137205 A1* | 5/2015 | Kim | H01L 29/7889 |
| | | | 257/314 |
| 2015/0262932 A1* | 9/2015 | Yamane | H01L 27/11582 |
| | | | 257/314 |
| 2017/0062461 A1* | 3/2017 | Takamatsu | H01L 27/11582 |
| 2017/0077113 A1* | 3/2017 | Nomachi | H01L 27/11556 |
| 2017/0179154 A1* | 6/2017 | Furihata | H01L 27/11524 |

* cited by examiner

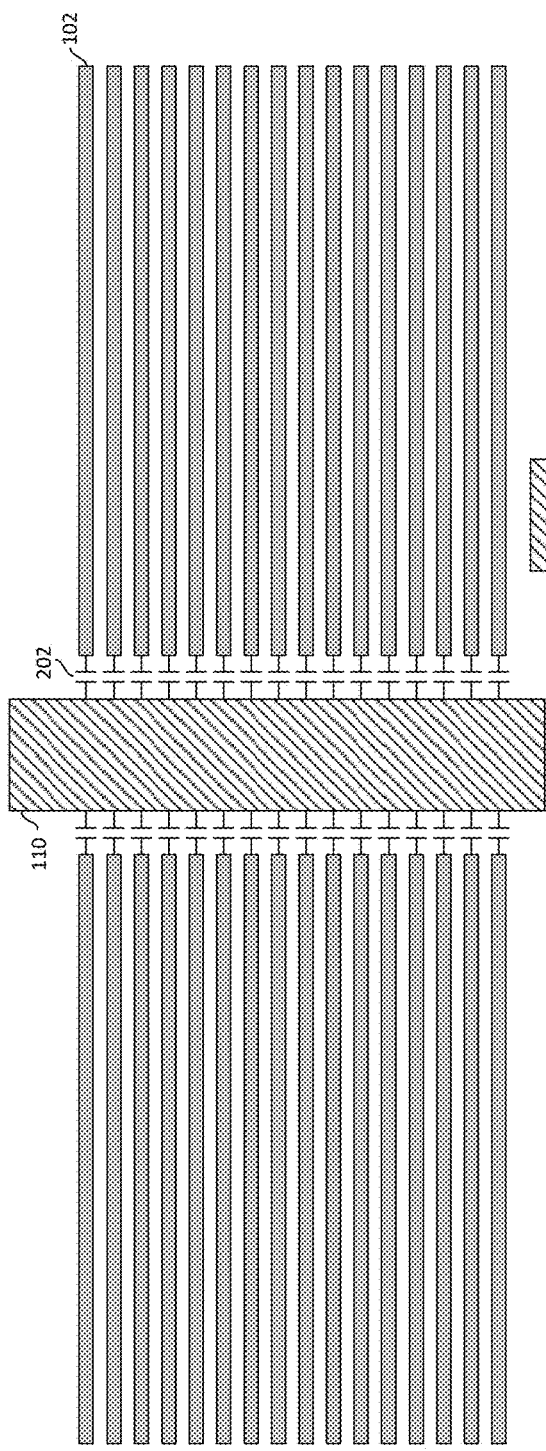
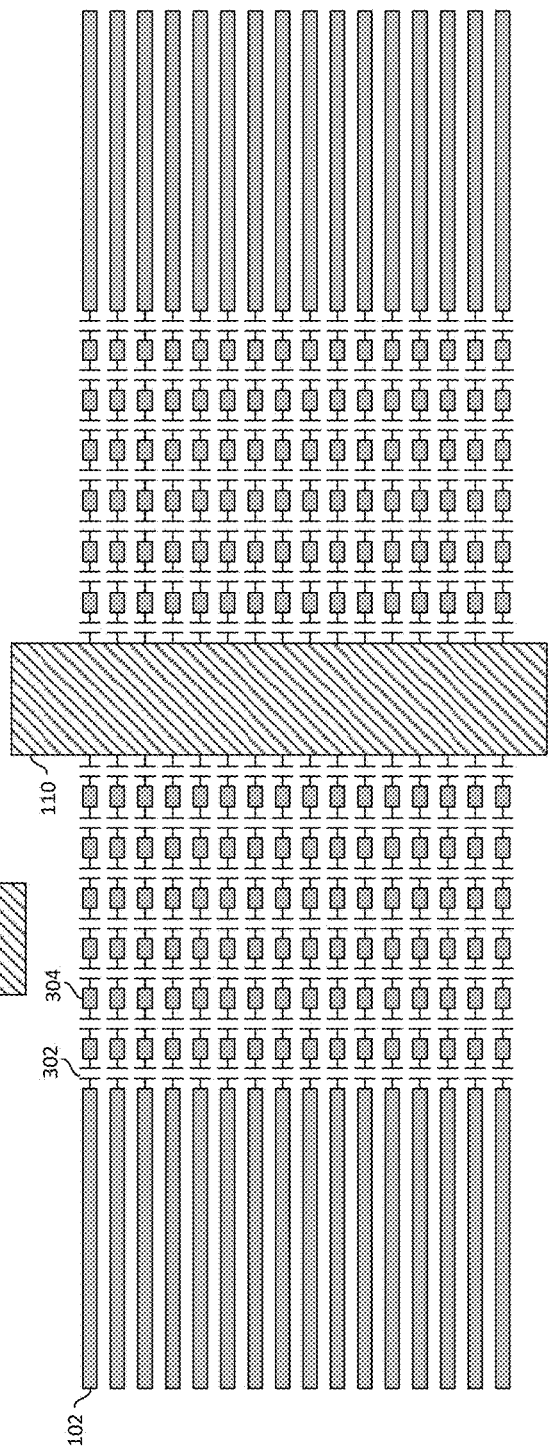

METHOD AND APPARATUS FOR REDUCING CAPACITANCE OF INPUT/OUTPUT PINS OF MEMORY DEVICE

FIELD

The present disclosure relates in general to the field of computer development, and more specifically, to memory devices.

BACKGROUND

A memory device may include one or more semiconductor memory chips that each comprise one or more arrays of memory cells to store data. The memory device may also include a plurality of input/output (I/O) pins that each couple to a respective bond pad of the one or more chips. The external I/O pins may allow signals to be sent to or from the memory device.

BRIEF DESCRIPTION OF THE DRAWINGS

FIG. 2 illustrates a representation of parasitic capacitance in a memory chip in accordance with certain embodiments.

FIG. 3 illustrates a representation of parasitic capacitance in a memory chip comprising slit channels to reduce the parasitic capacitance in accordance with certain embodiments.

Like reference numbers and designations in the various drawings indicate like elements.

DETAILED DESCRIPTION

The concepts of various embodiments are applicable to memory devices used in any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
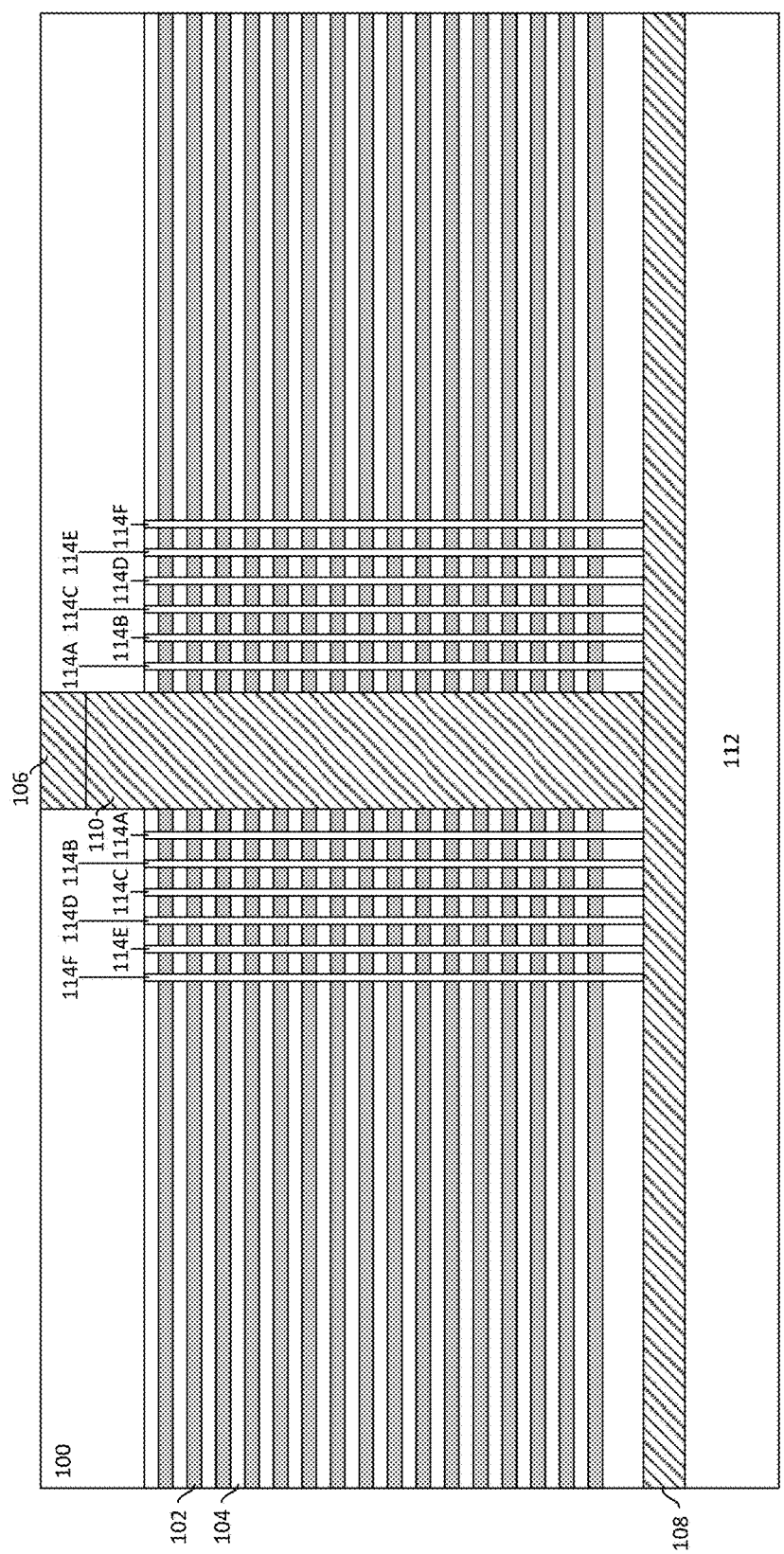
FIG. 1 illustrates a horizontal cross section of a portion of a memory chip comprising slit channels to reduce parasitic capacitance in accordance with certain embodiments.

FIG. 1 illustrates a portion of a memory chip 100 comprising slit channels 114 (114A-114F) to reduce parasitic capacitance in accordance with certain embodiments. FIG. 1 depicts a horizontal cross section of a portion of the memory chip 100. Memory chip 100 comprises a tier of alternating layers of polysilicon 102 and a dielectric material 104. The memory cells of the memory chip 100 may be formed in the polysilicon layers 102 (for example, each layer may comprise at least one wordline of the memory chip 100).

Although this disclosure will focus on a tier that includes alternating polysilicon layers 102 and dielectric layers 104, any of the embodiments described herein may utilize layers comprising any suitable conductive material or layers including polysilicon and one or more other materials in place of the polysilicon layers. Thus, a tier may comprise alternating layers of dielectric materials and any suitable conductive layers (i.e., layers that comprise (at least in part) conductive materials such as polysilicon, tungsten, other metal, or other suitable conductive material). In a particular embodiment, a tier may be formed by placing alternating layers of silicon nitride and a dielectric material. In a particular embodiment, at least a portion of the silicon nitride may be exhumed and replaced with a conductive material. In particular embodiments, the tier may be a tier formed using any suitable alternating layers that may be used to form arrays of replacement gate or charge trap NAND memory cells.

The memory chip 100 may include any suitable number of bond pads 106. A bond pad may comprise an area of conductive material that is used to connect circuitry of memory chip 100 to a connection external to the memory chip on which the bond pad is disposed (e.g., a pin on a packaged chip). In the embodiment depicted, bond pad 106 is coupled to a lower metal layer 108 by a via 110 that extends in a generally vertical direction through the through tier of polysilicon and dielectric layers.

The via 110 may be separated from the layers 102 and 104 of the tier by a thin gap, which may include any one or more dielectric materials, such as an oxide (e.g., silicon dioxide), a silicate glass, a low-k insulator (such as silicon oxycarbide), air, or other suitable dielectric material. The proximity of the polysilicon layers 102 to the via 110 may result in capacitive coupling between the polysilicon layers 102 and the via 110. Because the via 110 is coupled to the bond pad 106 (which in turn may be coupled to an external I/O pin, e.g., of a semiconductor package), this parasitic capacitance may result in decreased performance of the memory chip 100 since high capacitance on an I/O pin may limit communication bandwidth.

FIG. 2 illustrates a representation of parasitic capacitance in a memory chip in accordance with certain embodiments.

Contrary to the embodiment of FIG. 1, the embodiment of FIG. 2 does not include slit channels 114 around the via 110. As depicted, each layer of polysilicon 102 is capacitively coupled to the via 110. Because the polysilicon layers are relatively large (effectively capacitively coupling the via 110 to ground), the resulting capacitances 202 may substantially affect the performance of an I/O pin coupled to the via 110.

One option to reduce the parasitic capacitance to the via caused by the polysilicon layers 102 includes eliminating the tier of polysilicon and dielectric layers in the bond pad area. In a particular embodiment, the bond pad area is located on the periphery of the memory chip and may include bond pads used for I/O. However, using a mask to eliminate the tier layers in the bond pad area may result in undesirable planarity issues.

Referring again to FIG. 1, in various embodiments of the present disclosure, after the tier has been formed, one or more slit channels 114 are formed through the tier, thus isolating portions of the layers. This effectively results in the parasitic capacitance on the via 110 being segmented into a series of capacitances as shown in FIG. 3.

FIG. 3 illustrates a representation of parasitic capacitance in memory chip 100 comprising slit channels 114 to reduce the parasitic capacitance in accordance with certain embodiments. As depicted, the slit channels 114 result in a plurality of parasitic capacitances 302 between portions 304 of the polysilicon layers. These parasitic capacitances 302 are coupled in series to the via 110, significantly reducing the overall capacitive coupling between the polysilicon layers 102 and the via 110, thus improving the performance of an I/O pin coupled to the via 110 (e.g., through the bond pad 106). In various embodiments, the one or more slit channels 114 may be formed using processing steps and/or masks that are used for other purposes during fabrication of the memory chip, thus these embodiments do not introduce extra cost or time.

The tier is formed of alternating (at least generally horizontally disposed) layers of polysilicon 102 and a dielectric material, such as an oxide (e.g., silicon dioxide), a silicate glass, a low-k insulator (such as silicon oxycarbide), or other suitable dielectric material. In a particular embodiment, these layers may be formed through deposition on top of a substrate 112 (there may be one or more other intervening layers formed prior to formation of the tier, such as lower metal layer 108 or other suitable layers). Any suitable deposition process may be used to form a polysilicon layer or a dielectric layer of the tier, such as physical vapor deposition (PVD), chemical vapor deposition (CVD), electrochemical deposition (ECD), molecular beam epitaxy (MBE), atomic layer deposition (ALD), or other suitable deposition process.

In various embodiments, any suitable number of polysilicon layers 102 and dielectric layers 104 may be present in the tier of memory chip 100. In a particular embodiment, a plurality of the polysilicon layers 102 (e.g., the majority of the polysilicon layers) are further processed to form active wordlines of memory arrays (with a polysilicon layer 102 forming one or more wordlines). One or more other polysilicon layers 102 may be used to form dummy wordlines and/or source and drain select gates.

Bond pad 106 may comprise any suitable conductive material. In a particular embodiment, bond pad 106 comprises a top layer metal of the memory chip 100. For example, bond pad 106, may comprise any one or more of aluminum, copper, gold, or other suitable conductive material. Bond pad 106 may be coupled to via 110.

Via 110 may comprise any suitable conductive material, such as any one or more of aluminum, copper, gold, tungsten or other suitable conductive material. Via 110 may be formed by removing a portion of the tier via any suitable process, such as a wet etch or a dry etch, and then filling the void with a conductive material. As described above, a thin layer of dielectric material may also be disposed between the via 110 and the tier layers (e.g., to avoid shorting out the poly layers). In various embodiments, multiple vias may extend from the bond pad 106 (and/or contacts coupled to the bond pad). Thus, in various embodiments, the single via 110 depicted may be replaced with multiple vias that each couple the bond pad 106 to the lower metal layer 108. Although the via 110 is shown as having the same width as the bond pad 106, in various embodiments the via 110 may have a different width (e.g., vias may generally be more narrow than the bond pad they are coupled to). Via 110 may be any suitable shape.

Lower metal layer 108 also comprises any suitable conductive material, such as any one or more of aluminum, copper, gold, tungsten or other suitable conductive material. Although a single lower metal layer 108 is depicted, memory chip 100 may include any suitable number of lower metal layers that are each separated from each other by dielectric layers. The lower metal layer 108 may couple the via 110 to any suitable circuitry of the memory chip 100, such as pull up or pull down drivers (e.g., N or P type field effect transistors (FETs)), electrostatic protection circuitry, or other suitable circuitry which may be formed, e.g., on the substrate 112.

Substrate 112 may comprise any suitable solid substance onto which a layer of another substance may be applied. For example, substrate 112 may be a thin slice of one or more of silicon, silicon dioxide, aluminum oxide, sapphire, germanium, gallium arsenide (GaAs), an alloy of silicon and germanium, indium phosphide (InP) or other suitable material. Various circuitry associated with memory chip 100 may be formed on the substrate, such as sense amplifiers, decoders, pull up or pull down drivers, electrostatic protection circuitry, or other circuitry.

Slit channels 114 represent relatively narrow channels. Slit channels 114 may be formed by etching through the layers of the tier (or otherwise removing portions of the layers). In a particular embodiment, multiple slit channels are formed during the same process step. For example, a mask that includes a pattern for one or more slit channels to surround each via of one or more vias 110 of the memory chip 100 may be applied and an etching material may be applied resulting in the formation of the slit channels. In a particular embodiment, this same process step may be used to etch other slit channels through the tier for purposes unrelated to reducing the capacitance of a via 110. For example, the process step may be used to etch slit channels that isolate blocks or wordlines of a memory array from each other (this etching may be performed in an area of the memory chip that includes the memory array, rather than the bond pad area). Thus, the same process step that would have already been used during fabrication of the memory chip 110 may also be used to form slit channels 114 around vias 110 coupled to respective bond pads. In various embodiments, after the portions of the tier have been removed to form the slit channels, the channels may be filled with a dielectric material, such as one or more of an oxide (e.g., silicon dioxide), a silicate glass, a low-k insulator (such as silicon oxycarbide), air, or other suitable dielectric material. In a particular embodiment, the dielectric material comprises a high aspect ratio fill material. In a particular embodiment, after a particular dielectric has been applied to fill at least a portion of the slit channels, a spin on dielectric may be added (e.g., a dielectric having a dielectric constant between the dielectric constant of silicon dioxide and the dielectric constant of air). Filling the channels with a solid material (such as an oxide) may promote structural integrity and prevent unwanted material from entering the etched portions during subsequent processing steps.

Figure 4:
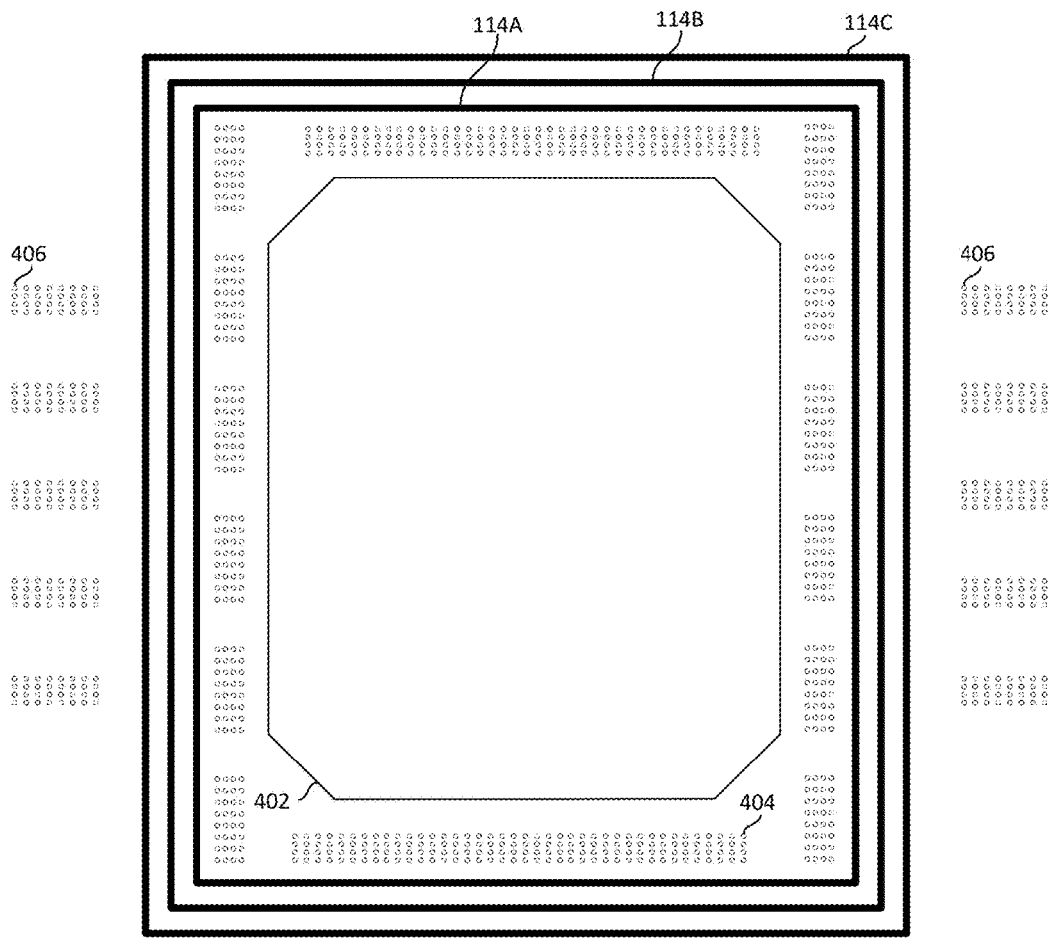
FIG. 4 illustrates a top view of a memory chip comprising slit channels to reduce parasitic capacitance in accordance with certain embodiments.

In particular embodiments, a slit channel 114 is a continuous channel around the via 110. For example, the two innermost slit channels 114A depicted the same channel that extends all the way around the via 110. This is more apparent in FIG. 4, which illustrates a top view of the memory chip 100. In FIG. 4, the slit channels are depicted as encompassing the perimeter of the bond pad 106 (the top of the bond pad is shown). The slit channels may extend from the top of the tier down to any suitable depth (e.g., to the bottom of the tier or below the bottom of the tier). Slit channel 114C surrounds slit channel 114B, which surrounds slit channel 114A, which surrounds one or more vias coupling the bond pad 106 to the lower metal layer 108.

Any suitable number of slit channels 114 may be formed around a particular via 110. Each slit channel 114 that is formed around the via 110 results in an added series capacitance that lowers the cumulative capacitance seen by an I/O pin coupled to the via 110. In a particular embodiment, multiple slit channels 114 may be formed concentrically around a via 110. In another embodiment, when multiple channels are formed around a via 110, the distance between adjacent pairs of channels may be equal. In other embodiments, the slit channels are not concentric and/or do not have equal distances between adjacent pairs of slit channels.

A slit channel 114 may have any suitable width at any depth of the tier (where the width of a slit channel at a particular depth in the tier is the distance across the slit channel from an edge of a neighboring layer of polysilicon to the next edge of the same layer of polysilicon on the other side of the slit channel, as opposed to the distance from the portion of the channel on one side of the via 110 to a portion of the channel on the other side of the via). In various embodiments, the width of the slit channel 114 may be generally uniform regardless of the depth of the slit channel. In a particular embodiment, the width of a slit channel at a particular depth of the tier (e.g., the bottom of the tier, the top of the tier, or at a depth in between) may be between 150 and 300 nanometers. In an embodiment, each slit channel of multiple slit channels around a via 110 may generally have the same width. In various embodiments, the width of a slit channel may vary at any point on the channel around the via and/or at any depth of the tier.

A slit channel 114 may have any suitable shape. In various embodiments, a channel may have the same shape as the perimeter of the bond pad 106. In a particular embodiment, a channel may have a generally square or rectangular shape.

In a particular embodiment, the slit channels may be coupled together via a conductive material (e.g., a metal) in order to prevent excessive charge buildup at any of the channels. In a particular embodiment, the conductive material coupling the channels together may be located below the tier.

Referring again to FIG. 4, in a particular embodiment, a bond pad 106 may comprise a conductive material deposited in a bond pad opening 402. The conductive material may extend over (and couple to) a plurality of groups of contacts 404. In FIG. 4, six groups of contacts are shown on each of first and second sides of the bond pad opening (i.e., the left and right side in the figure), and a larger group is shown on each of third and fourth sides of the bond pad opening (i.e., the top and bottom side in the figure). In a particular embodiment, each contact 404 of a group of contacts 404 couples to a via for that group. Thus each group of contacts 404 may be coupled to its own respective via that extends to the lower metal layer 108 (thus fourteen separate vias surrounding a via below the bond pad opening 402 may couple to the lower metal layer 108). In another embodiment, the groups of contacts 404 and the conductive material deposited in bond pad opening 402 all couple to a single via extending down to the lower metal layer 108. As a bond pad may be coupled to a single via or multiple vias that extend down to the lower metal layer 108, references herein to via 110 may, in some embodiments, refer to any one of such vias or to the vias collectively.

Memory chip 100 may also include other contacts 406 and/or bond pads that are not surrounded by slit channels 114. For example, contacts 406 may couple to ground, power, or other low frequency signals may not be as sensitive to parasitic capacitance and thus do not have channels formed around them.

Figure 5A:
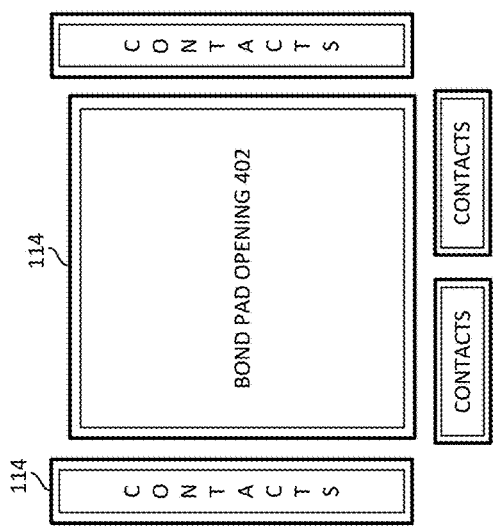
FIGS. 5A-5D illustrate example placements of slit channels 114 with respect to contacts and bond pad openings.
Figure 5C:
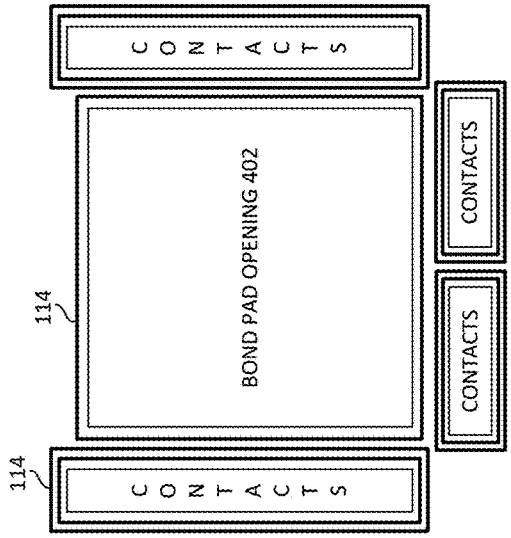
Figure 5B:
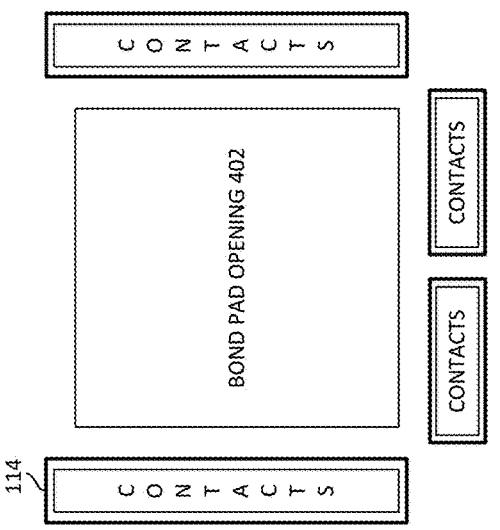
Figure 5D:
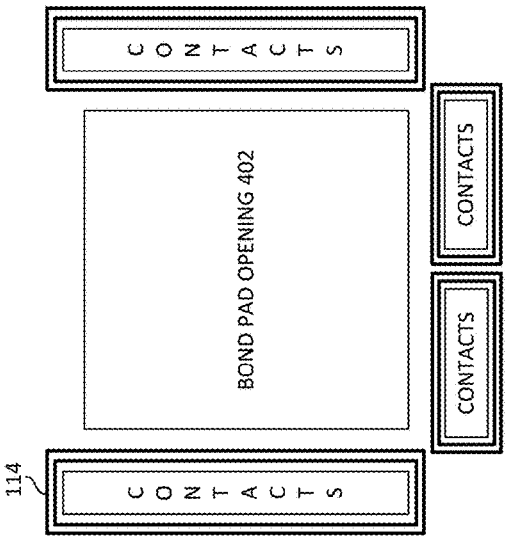

FIGS. 5A-5D illustrate example placements of slit channels 114 with respect to contacts and bond pad openings. These figures represent top views. The illustrated slit channels 114 may extend from the top of the tier (or above the top of the tier) down through the tier (e.g., as illustrated in FIG. 1). In FIG. 5A, a single slit channel 114 is placed around each group of contacts that surround the bond pad opening 402. In FIG. 5B, a slit channel 114 is placed around each group of contacts and a slit channel is placed around the bond pad opening 402. In FIG. 5C, multiple slit channels 114 are placed around each group of contacts. In FIG. 5D, multiple slit channels 114 are placed around each group of contacts and a single channel is placed around the bond pad. In various embodiments, any suitable number of channels may be placed around each group of contacts, each bond pad, and/or the perimeter of the bond pad and contacts (e.g., FIG. 4 depicts the slit channels 114 placed around the periphery of the entire bond pad which includes the bond pad opening and contacts).

Figure 6:
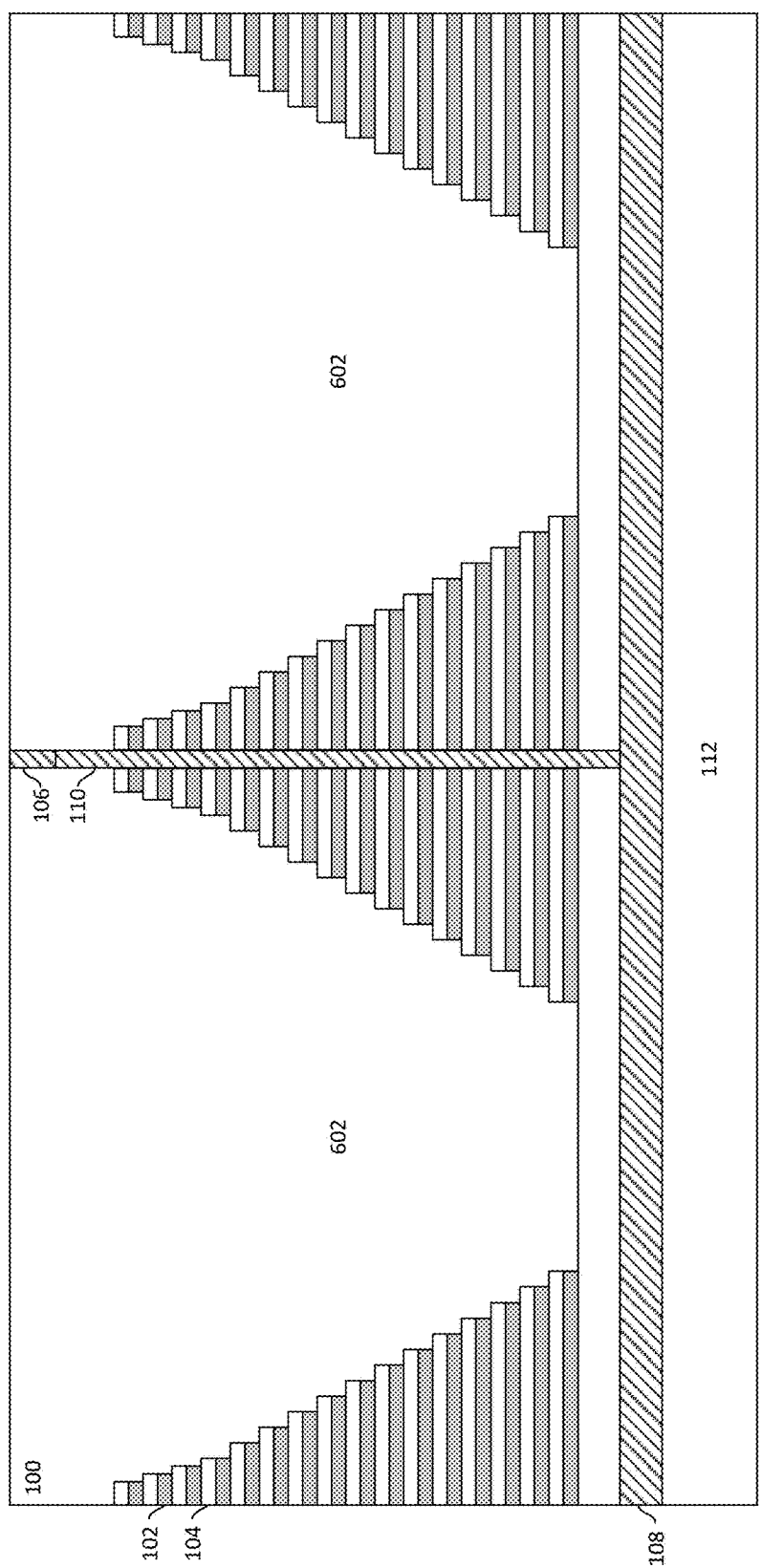
FIG. 6 illustrates a horizontal cross section of a portion of a memory chip comprising a staircase channel to reduce parasitic capacitance in accordance with certain embodiments.

FIG. 6 illustrates a portion of a memory chip 100 comprising a staircase channel 602 formed around a via 110 to reduce parasitic capacitance in accordance with certain embodiments. The staircase channel 602 may have any suitable characteristics of a slit channel 114 described above and/or any of the characteristics described below.

During fabrication, a plurality of masks may be applied and etches of various depths may be performed (or the material of the tier may be removed in any other suitable manner) in order to provide individual connections (e.g., by vias) from above the tier to each layer of polysilicon 102 in order to connect to memory cells in the respective polysilicon layers. In a particular embodiment, these connections may be the NAND strings that connect to bitlines of the array. In various embodiments, these etches are performed in or proximate to the area of the memory chip that includes the memory cell array, rather than the I/O area (i.e., where the bond pads are located). In a particular embodiment, multiple different masks are applied, and an etch of a different depth is performed using each mask (e.g., an etch of 53 poly layers may be performed when a first mask is applied, an etch of 27 poly layers may be performed when a second mask is applied, and so on).

In particular embodiments, these masks may also be used to form channel 602 through the tier proximate the bond pad, thus no additional masks or etching steps are performed in order to form channel 602. In various embodiments, channel 602 may be filled with a dielectric material, such as an oxide (e.g., silicon dioxide), a silicate glass, a low-k insulator (such as silicon oxycarbide), air, or other suitable dielectric material.

In a particular embodiment, the width of the channel 602 increases monotonically from the bottom of the tier, that is, the channel is widest at the top of the channel and progressively narrows towards the bottom of the tier. Although not shown, in various embodiments, the width of the channel 602 at adjacent layers (and/or adjacent polysilicon layers) of the pier may be equal or substantially equal (e.g., the same mask may be used to provide an equally wide portion of the channel for multiple layers of the tier).

In a particular embodiment, channel 602 is a relatively wide channel. For example, channel 602 may have a bottom width (i.e., the width at the bottom of the tier) of between 3 and 5 microns. In other embodiments, the channel 602 may have any suitable dimensions. In various embodiments, multiple channels 602 may be formed around a via 110, though if the channel is wide enough, the parasitic capacitance may be reduced such that a suitable capacitance may be realized without additional channels.

Figure 7:
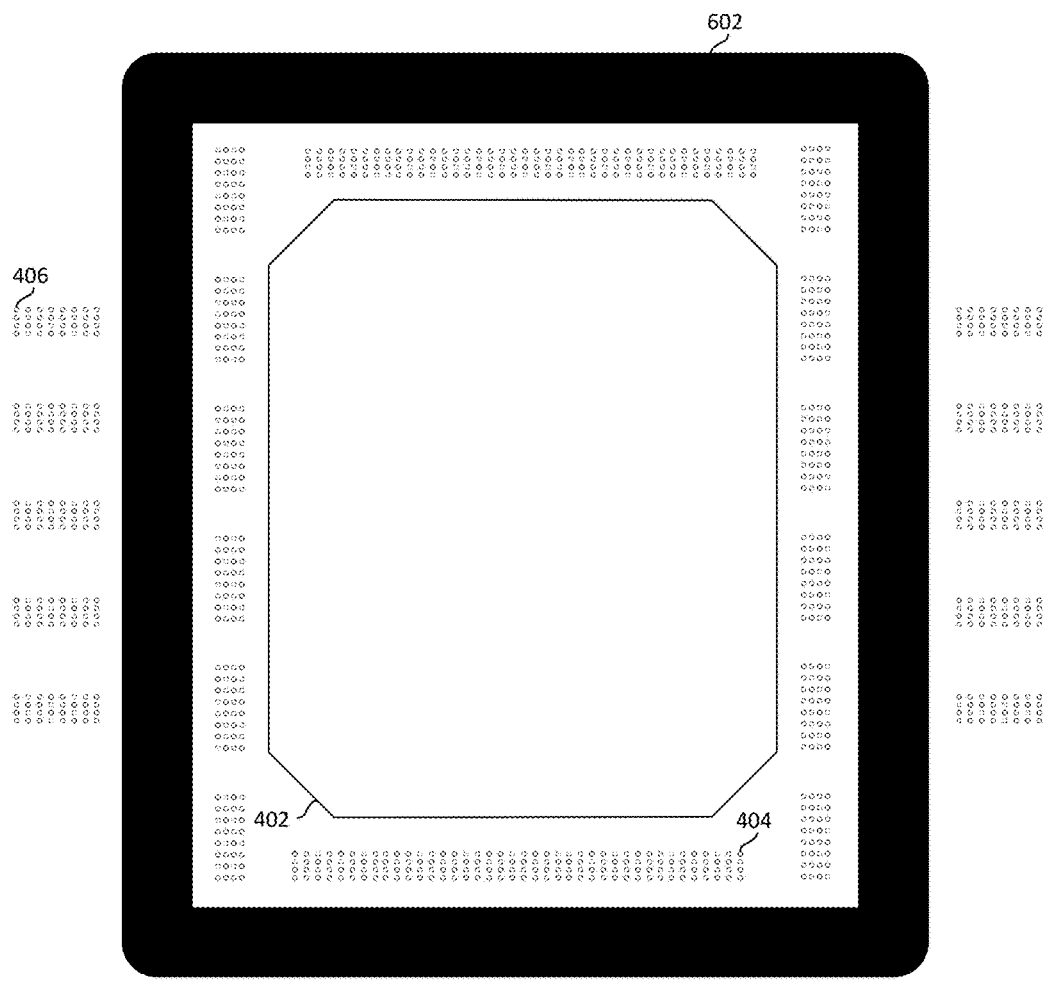
FIG. 7 illustrates a top view of a memory chip comprising a staircase channel to reduce parasitic capacitance in accordance with certain embodiments.

FIG. 6 represents a horizontal cross section, thus the channel 602 may be formed such that it surrounds via 110. This is more apparent in FIG. 7, which illustrates a top view of a memory chip 100 comprising a staircase channel 602 in accordance with certain embodiments. Although channel 602 is shown as having a uniform width in FIG. 7, as explained already, in some embodiments the channel 602 may decrease in width towards the bottom of the tier (thus different depths of the tier may be associated with different channel widths). FIG. 7 illustrates a bond pad structure that is similar to the structure shown in FIG. 4. In this embodiment, the channel 602 is formed outside the perimeter of the bond pad 106 (i.e., outside both the bond pad opening 402 and contacts 404), thus the channel 602 will surround any vias coupled to the bond pad 106 and/or contacts 404.

Figure 8:
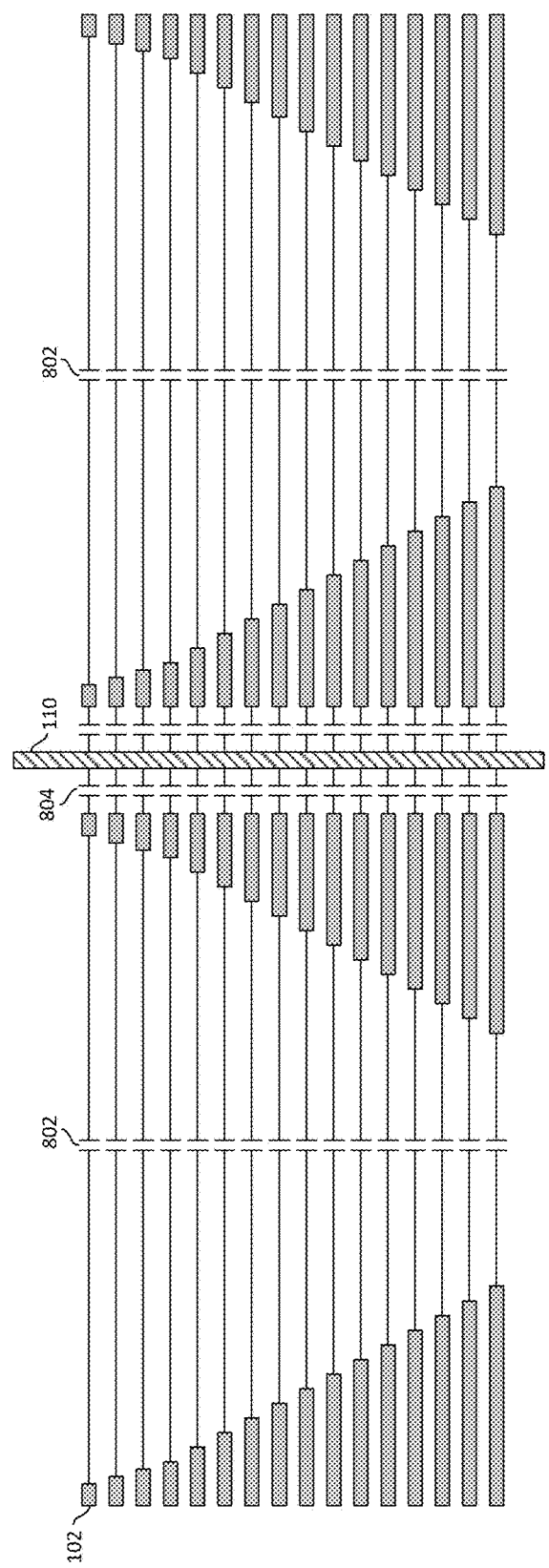
FIG. 8 illustrates a representation of parasitic capacitance of a memory chip comprising a staircase channel to reduce parasitic capacitance in accordance with certain embodiments.

FIG. 8 illustrates a schematic representation of a memory chip comprising a staircase channel to reduce parasitic capacitance in accordance with certain embodiments. As depicted, adding the channel 602 results in adding a capacitance 802 in series with the capacitance 804 between the via 110 and a neighboring polysilicon layer 102 (e.g., the capacitance through the dielectric separating the via from the polysilicon layer). In addition to decreasing the effective capacitance due to the addition of the capacitance in series, the capacitance is further decreased because the capacitances 802 will be fairly small due to the large distance in the channel between corresponding portions of each particular layer of polysilicon 102.

In various embodiments, a staircase channel 602 and one or more slit channels 114 may be formed around one or more vias 110 coupled to a particular bond pad to reduce the parasitic capacitance coupled to the bond pad. In various embodiments, the one or more slit channels 114 are placed closer to the via 110 than the staircase channel 602 while in other embodiments, the staircase channel 602 is placed closer to the via 110 than the one or more slit channels 114.

Figure 9:
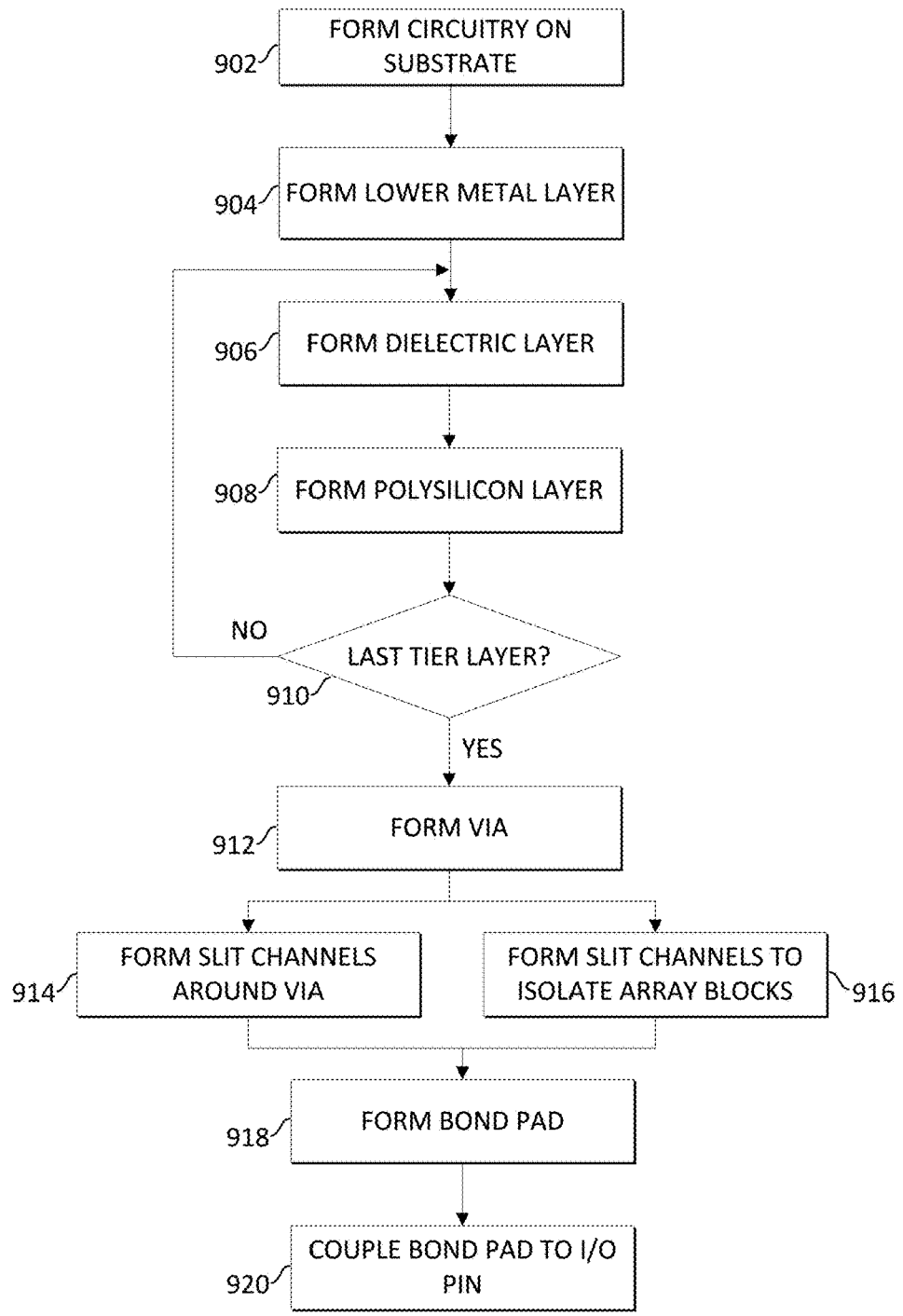
FIG. 9 illustrates a flow for forming one or more slit channels in a memory chip to reduce parasitic capacitance in accordance with certain embodiments.

FIG. 9 illustrates a flow for forming one or more slit channels 114 in a memory chip 100 to reduce parasitic capacitance in accordance with certain embodiments. At 902, various circuitry of a memory chip 100 is formed on a substrate. For example, pull up or pull down drivers, electrostatic protection circuitry, sense amplifiers, decoders, and/or other circuitry may be formed. At 904, lower metal layer 108 is formed.

At 906 a dielectric layer of the tier is formed. The dielectric layer may be any suitable material formed in any suitable manner. In a particular embodiment, a thin layer of silicon dioxide is formed using CVD. At 908, a polysilicon layer of the tier is formed over the dielectric layer. The polysilicon layer may be formed in any suitable manner. In a particular embodiment, a thin layer of polysilicon is formed using CVD. At 910 if the polysilicon layer is not the last layer of the tier, then the flow returns to 906 for the formation of additional layers of the tier.

At 912, a via is formed by removing (e.g., through etching) a portion of the tier and depositing a conductive material in the removed portion (as well as a dielectric material so that the conductive material does not couple the polysilicon layers together). In various embodiments, one or more vias for each of one or more bond pads may be formed simultaneously.

At 914, one or more slit channels are formed around the via formed at 912. The slit channels may each be formed by removing (e.g., by etching after application of a mask) through at least a portion of the tier and placing a dielectric material (e.g., silicon dioxide) therein. At 916, slit channels to isolate array blocks from each other are formed. In a particular embodiment, these slit channels are formed using the same mask and etching step used to form the slit channels surrounding the via. In a particular embodiment, these slit channels are formed at a different part of the chip (e.g., at a portion of the chip dedicated to the memory cells rather than the portion of the chip that is to include the bond pads).

At 918, a bond pad is formed, e.g., by depositing a conductive material over the via. The bond pad is coupled to the via during formation. At 920, the bond pad is coupled to an I/O pin. In various embodiments, the bond pad is coupled to an I/O pin of a semiconductor package including the memory chip 100.

Figure 10:
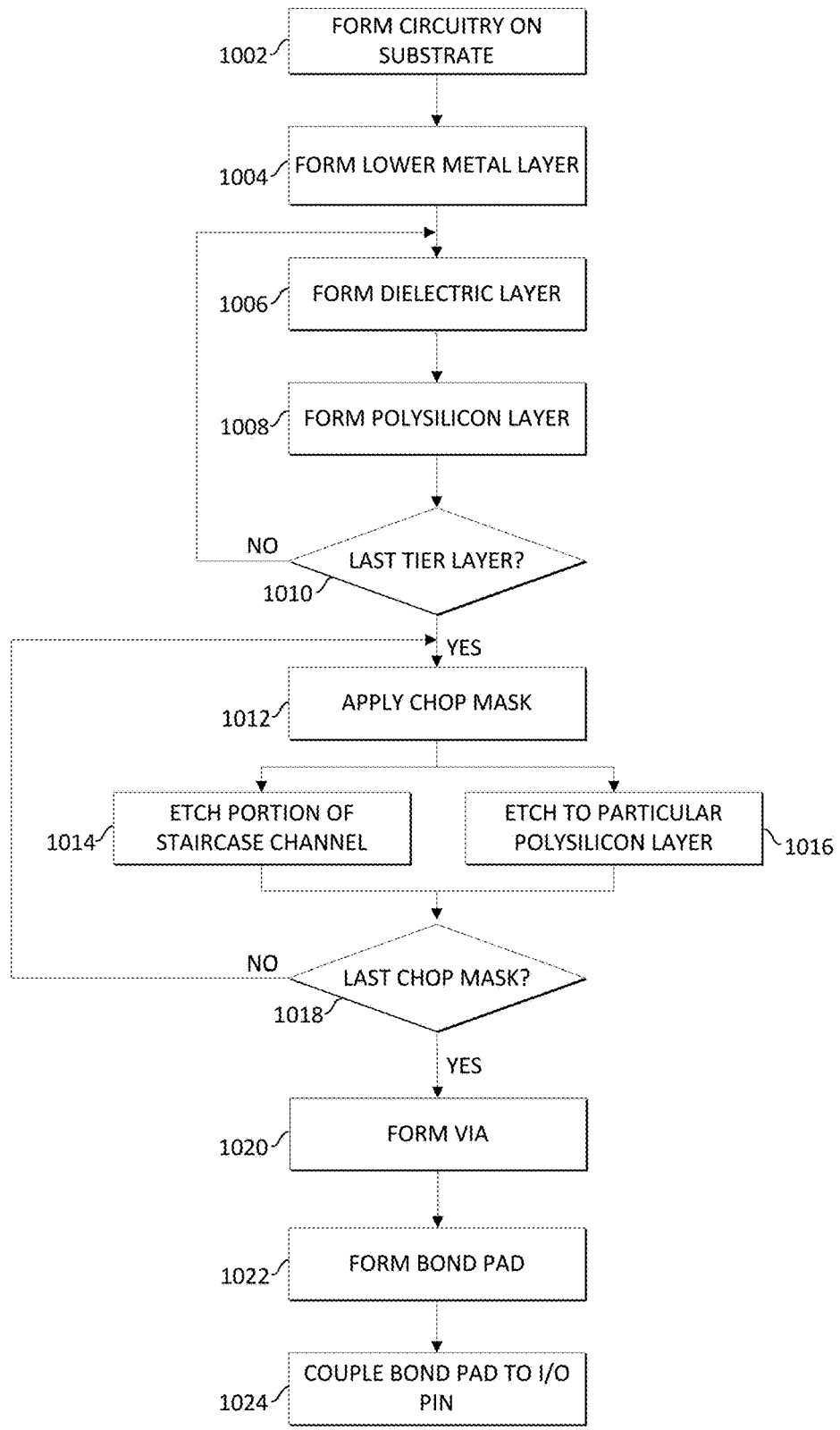
FIG. 10 illustrates a flow for forming a staircase channel in a memory chip to reduce parasitic capacitance in accordance with certain embodiments.

FIG. 10 illustrates a flow for forming a staircase channel 602 in a memory chip 100 to reduce parasitic capacitance in accordance with certain embodiments. At 1002, various circuitry of a memory chip 100 is formed on a substrate. For example, pull up or pull down drivers, electrostatic protection circuitry, sense amplifiers, decoders, and/or other circuitry may be formed. At 1004, lower metal layer 108 is formed.

At 1006 a dielectric layer of the tier is formed. The dielectric layer may be any suitable material formed in any suitable manner. In a particular embodiment, a thin layer of silicon dioxide is formed using CVD. At 1008, a polysilicon layer of the tier is formed over the dielectric layer. The polysilicon layer may be formed in any suitable manner. In a particular embodiment, a thin layer of polysilicon is formed using CVD. At 1010 if the polysilicon layer is not the last layer of the tier, then the flow returns to 1006 for formation of additional layers of the tier.

At 1012, a chop mask is applied. The chop mask is a mask used to etch to a particular layer of the tier (i.e., to a particular depth in the tier). At 1014, a portion of a staircase channel is etched through the tier in a pattern around the via. At the same time at 1016, the same chop mask is used to etch to a particular polysilicon layer in order to allow the polysilicon layer (which may, e.g., form a wordline of a memory array) to be coupled to a conductive via formed in the portion that was etched. At 1018, if this is not the last chop mask to be applied, the flow returns to 1012 where a different chop mask is applied. Additional portions of the staircase channel are formed and additional etches to particular polysilicon layers are performed until the last chop mask has been applied. In various embodiments, the staircase channel is filled with a dielectric material (e.g., after each etch has been performed or after all the etches have been performed).

At 1020, a via is formed by removing (e.g., through etching) a portion of the tier and depositing a conductive material in the removed portion (as well as a dielectric material so that the conductive material does not couple the polysilicon layers together). In various embodiments, one or more vias for each of one or more bond pads may be formed simultaneously.

At 1022, a bond pad is formed, e.g., by depositing a conductive material over the via. The bond pad is coupled to the via during formation. At 1024, the bond pad is coupled to an I/O pin. In various embodiments, the bond pad is coupled to an I/O pin of a semiconductor package including the memory chip 100.

The flows described in FIGS. 9-10 are merely representative of operations that may occur in particular embodiments. In other embodiments, additional operations may be performed in the flows (e.g., the various memory cells of the array may be formed). Various embodiments of the present disclosure contemplate any suitable signaling mechanisms for accomplishing the functions described herein. Some of the operations illustrated in FIGS. 9-10 may be repeated, combined, modified or deleted where appropriate. Additionally, operations may be performed in any suitable order without departing from the scope of particular embodiments.

Figure 11:
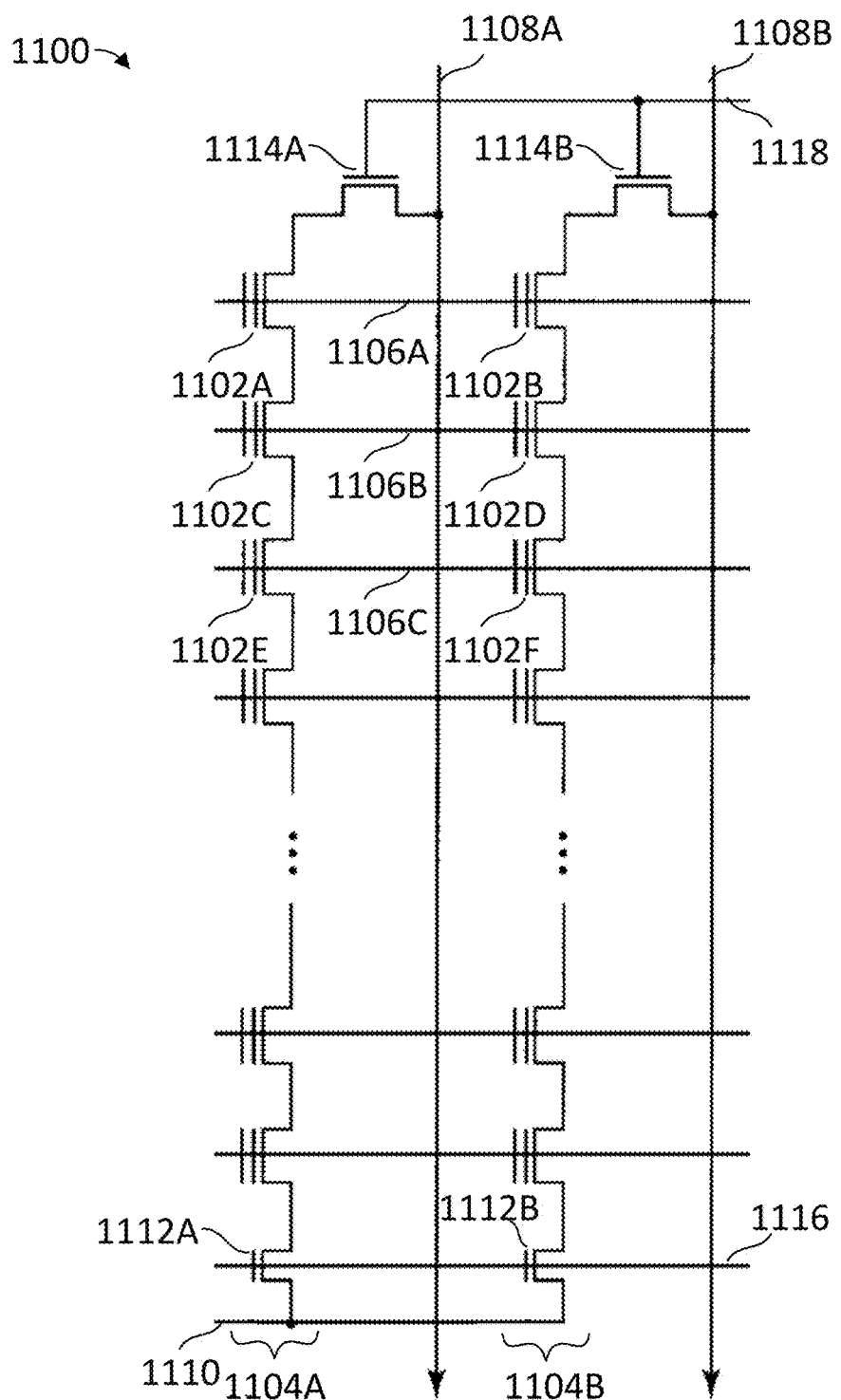
FIG. 11 illustrates an example portion of a NAND flash memory array in accordance with certain embodiments.

FIG. 11 illustrates an example portion of a NAND flash memory array 1100 in accordance with certain embodiments. In various embodiments, a memory chip 100 may comprise one or more NAND flash memory arrays. NAND flash memory array 1100 may comprise a plurality of non-volatile memory cells 1102 arranged in columns such as series strings 1104. In particular embodiments the cells 1102 of the NAND flash memory arrays may be formed in the tier of polysilicon layers and dielectric layers. In various embodiments, each memory cell 1102 may comprise a transistor with a floating gate that stores charge indicative of one or more bit values stored by the memory cell 1102. Other embodiments may include memory cells utilizing replacement gate or charge trap technology. In the series strings 1104, the drains of the cells 1102 are each (with the exception of the top cell) coupled to a source of another cell 1102.

The array 1100 also includes wordlines 1106 (e.g., 1106A-1106C). A wordline 1106 may span across multiple series strings 1104 (e.g., a wordline may be coupled to a memory cell 1102 of each series string 1104) and is connected to the control gates of the memory cells 1102 of a row of the array 1100 and used to bias the control gates of the memory cells 1102 of the row. The bitlines 1108 (e.g., 1108A, 1108B) are each coupled to a respective series string 1104 by a respective drain select gate 1114 (e.g., 1114A, 1114B). The bitlines may also be coupled to sensing circuitry that detects the state of each cell by sensing voltage or current of each sensed bitline 1108.

Each series string 1104 of memory cells is coupled to a source line 1110 by a source select gate 1112 and to an individual bitline 1108 by a drain select gate 1114. The source select gates 1112 are controlled by a source select gate control line 1116 and the drain select gates 1114 are controlled by a drain select gate control line 1118. In other embodiments, multiple drain select gate control lines 1118 may be used (such that one drain select gate control line may control a subset of the drain select gates 1114, another drain select gate control line may control a different subset of the drain select gates 1114, and so on). The source line 1110 may be coupled to a fixed bias voltage (e.g., $V_{SRC}$). In various embodiments, $V_{SRC}$ may be set to ground or positively biased (e.g., between 0 and ~1.5V).

Figure 12:
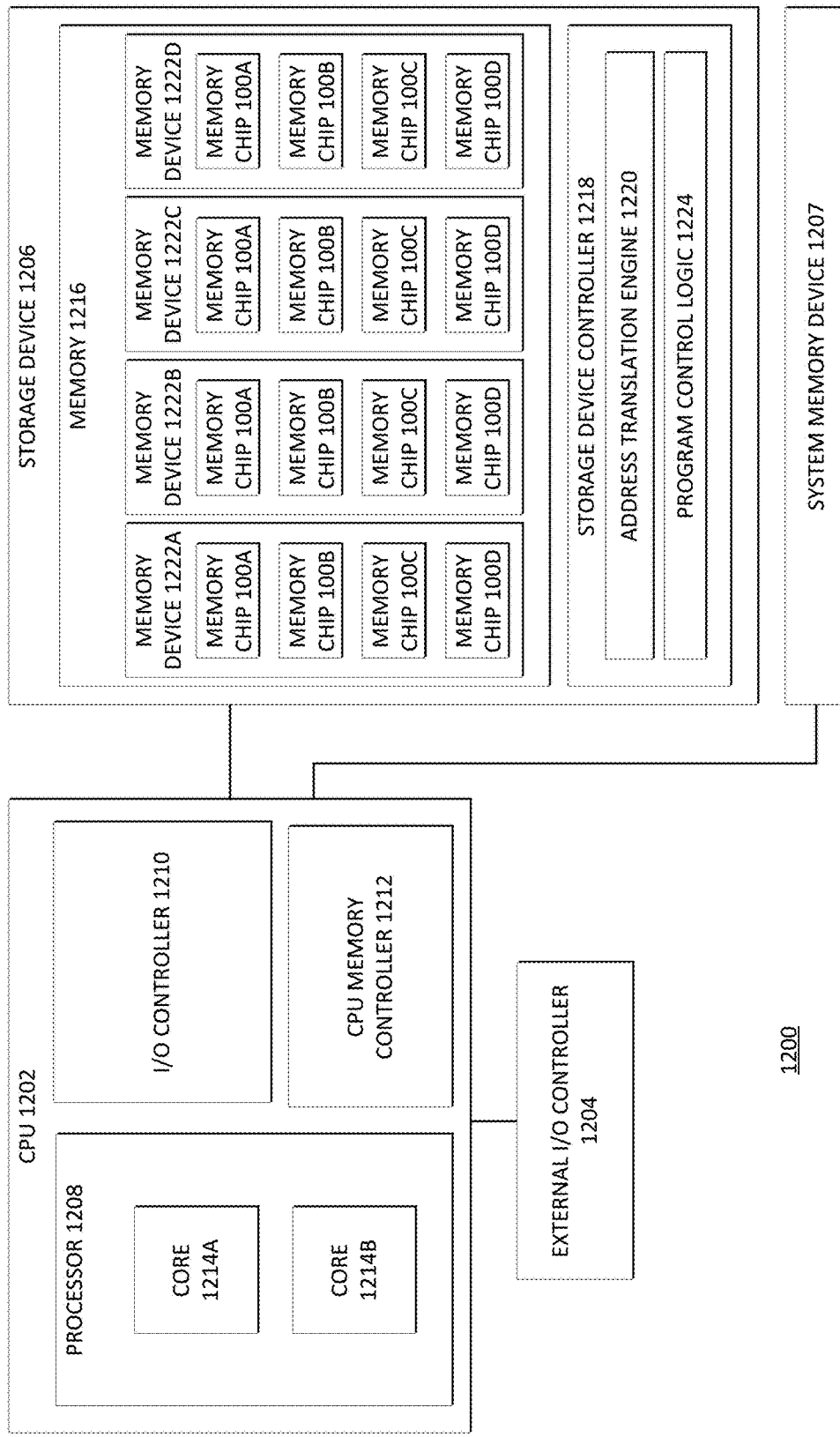
FIG. 12 illustrates a block diagram of components of a computer system in accordance with certain embodiments.

FIG. 12 illustrates a block diagram of components of a computer system 1200 in accordance with certain embodiments. System 1200 includes a central processing unit (CPU) 1202 coupled to an external input/output (I/O) controller 1204, storage device 1206, and system memory device 1207. During operation, data may be transferred between storage device 1206 or system memory device 1207 and the CPU 1202. In various embodiments, particular data operations (e.g., erase, program, and read operations) involving a storage device 1206 or system memory device 1207 may be managed by an operating system or other software application executed by processor 1208.

In various embodiments, a storage device 1206 comprises NAND flash memory (herein a storage device comprising NAND flash memory is referred to as a NAND flash storage device). In some embodiments, storage device 1206 may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 1206 may include any number of memories 1216 and each memory 1216 may include any number of memory devices 1222 (e.g., 1222A-D). In a particular embodiment, a memory device 1222 may be or comprise a semiconductor package with one or more memory chips 100 (e.g., memory chips 100A-D). In the embodiment depicted, memory 1216 includes memory devices 1222A-D (while specific references herein may be made to memory device 1222A, the other memory devices may have any suitable characteristics of memory device 1222A).

CPU 1202 comprises a processor 1208, such as a microprocessor, an embedded processor, a digital signal processor (DSP), a network processor, a handheld processor, an application processor, a co-processor, a system on a chip (SOC), or other device to execute code (i.e., software instructions). Processor 1208, in the depicted embodiment, includes two processing elements (cores 1214A and 1214B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 1214 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 1210 is an integrated I/O controller that includes logic for communicating data between CPU 1202 and I/O devices, which may refer to any suitable devices capable of transferring data to and/or receiving data from an electronic system, such as CPU 1202. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 1206 that may be coupled to the CPU 1202 through I/O controller 1210.

An I/O device may communicate with the I/O controller 1210 of the CPU 1202 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 1210 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 1202) or may be integrated on the same chip as the CPU 1202.

CPU memory controller 1212 is an integrated memory controller that includes logic to control the flow of data going to and from one or more system memory devices 1207. CPU memory controller 1212 may include logic operable to read from a system memory device 1207, write to a system memory device 1207, or to request other operations from a system memory device 1207. In various embodiments, CPU memory controller 1212 may receive write requests from cores 1214 and/or I/O controller 1210 and may provide data specified in these requests to a system memory device 1207 for storage therein. CPU memory controller 1212 may also read data from a system memory device 1207 and provide the read data to I/O controller 1210 or a core 1214. During operation, CPU memory controller 1212 may issue commands including one or more addresses of the system memory device 1207 in order to read data from or write data to memory (or to perform other operations). In some embodiments, CPU memory controller 1212 may be implemented on the same chip as CPU 1202, whereas in other embodiments, CPU memory controller 1212 may be implemented on a different chip than that of CPU 1202. I/O controller 1210 may perform similar operations with respect to one or more storage devices 1206.

The CPU 1202 may also be coupled to one or more other I/O devices through external I/O controller 1204. In a particular embodiment, external I/O controller 1204 may couple a storage device 1206 to the CPU 1202. External I/O controller 1204 may include logic to manage the flow of data between one or more CPUs 1202 and I/O devices. In particular embodiments, external I/O controller 1204 is located on a motherboard along with the CPU 1202. The external I/O controller 1204 may exchange information with components of CPU 1202 using point-to-point or other interfaces.

A system memory device 1207 may store any suitable data, such as data used by processor 1208 to provide the functionality of computer system 1200. For example, data associated with programs that are executed or files accessed by cores 1214 may be stored in system memory device 1207. Thus, a system memory device 1207 may include a system memory that stores data and/or sequences of instructions that are executed or otherwise used by the cores 1214. In various embodiments, a system memory device 1207 may store persistent data (e.g., a user's files or instruction sequences) that remains stored even after power to the system memory device 1207 is removed. A system memory device 1207 may be dedicated to a particular CPU 1202 or shared with other devices (e.g., one or more other processors or other device) of computer system 1200.

In various embodiments, a system memory device 1207 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory array is synchronous dynamic random access memory (SDRAM). In some embodiments, any portion of memory 1207 that is volatile memory can comply with JEDEC standards including but not limited to Double Data Rate (DDR) standards, e.g., DDR3, 4, and 5, or Low Power DDR4 (LPDDR4) as well as emerging standards.

A storage device 1206 may store any suitable data, such as data used by processor 1208 to provide functionality of computer system 1200. For example, data associated with programs that are executed or files accessed by cores 1214A and 1214B may be stored in storage device 1206. Thus, in some embodiments, a storage device 1206 may store data and/or sequences of instructions that are executed or otherwise executed by the cores 1214A and 1214B. In various embodiments, a storage device 1206 may store persistent data (e.g., a user's files or software application code) that remains stored even after power to the storage device 1206 is removed. A storage device 1206 may be dedicated to CPU 1202 or shared with other devices (e.g., another CPU or other device) of computer system 1200.

In the embodiment depicted, storage device 1206 includes a storage device controller 1218 and a memory 1216 comprising four memory devices 1222A-D operable to store data, however, a storage device may include any suitable number of memory devices. A memory device 1222A includes a plurality of memory cells that are each operable to store one or more bits. The cells of a memory device 1222A may be arranged in any suitable fashion, such as in rows (e.g., wordlines) and columns (e.g., bitlines), three dimensional structures, and/or other manner. In various embodiments, the cells may be logically grouped into banks, blocks, subblocks, wordlines, pages, frames, bytes, or other suitable groups. In various embodiments, a memory device 1222A comprises one or more NAND flash memory arrays.

A memory device 1222A may include any of the volatile or non-volatile memories listed above or other suitable memory. In particular embodiments, memory device 1222A includes non-volatile memory, such as planar or 3D NAND flash memory. In particular embodiments, a memory device 1222A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 1206 comprising NAND flash memory may receive a command that has a format compliant with a DDR-based standard and may translate the command into one or more commands that are compatible with NAND flash memory of the storage device 1206. Similarly, the storage device 1206 may format results from operations performed on the NAND flash memory into a format that is compliant with a DDR-based standard before transmitting the results to the CPU 1202.

In a particular embodiment, a memory device 1222 is a semiconductor package. In various embodiments, a semiconductor package may comprise a casing comprising one or more semiconductor dies (also referred to as chips) (e.g., memory chips 100A-D). A package may also comprise contact pins or leads used to connect to external circuits. However, a package is merely one example form a memory device 1222 may take as a memory device may be any suitable arrangement of one or more memory arrays and associated logic in any suitable physical arrangement. For example, although a single physical package may include a single memory device 1222, multiple memory devices 1222 could be resident on a single package or a memory 1222 could be spread across multiple packages.

A memory 1216 may be embodied in one or more different physical mediums, such as a circuit board, die, disk drive, other medium, or any combination of thereof (or combination with one or more packages). In a particular embodiment, memory 1216 comprises a circuit board coupled to a plurality of memory devices 1222 that each comprise a semiconductor package.

Storage device 1206 may comprise any suitable type of memory and is not limited to a particular speed, technology, or form factor of memory in various embodiments. For example, a storage device 1206 may be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 1200 may include multiple different types of storage devices. Storage device 1206 may include any suitable interface to communicate with CPU memory controller 1212 or I/O controller 1210 using any suitable communication protocol such as a DDR-based protocol, PCI, PCIe, USB, SAS, SATA, FC, System Management Bus (SMBus), or other suitable protocol. A storage device 1206 may also include a communication interface to communicate with CPU memory controller 1212 or I/O controller 1210 in accordance with any suitable logical device interface specification such as NVMe, AHCI, or other suitable specification. In particular embodiments, storage device 1206 may comprise multiple communication interfaces that each communicate using a separate protocol with CPU memory controller 1212 and/or I/O controller 1210.

Storage device controller 1218 may include logic to receive requests from CPU 1202 (e.g., via CPU memory controller 1212 or I/O controller 1210), cause the requests to be carried out with respect to a memory 1216 (or memory devices(s) thereof), and provide data associated with the requests to CPU 1202 (e.g., via CPU memory controller 1212 or I/O controller 1210). Controller 1218 may also be operable to detect and/or correct errors encountered during memory operation. In an embodiment, controller 1218 also tracks the number of times particular cells (or logical groupings of cells) have been written to in order to perform wear leveling and/or to detect when cells are nearing an estimated number of times they may be reliably written to. In performing wear leveling, the storage device controller 1218 may evenly spread out write operations among blocks of the memory of a memory 1216 such that particular blocks are not written to more than other blocks. In various embodiments, controller 1218 may also monitor various characteristics of the storage device 1206 such as the temperature or voltage and report associated statistics to the CPU 1202. Storage device controller 1218 can be implemented on the same circuit board or device as a memory 1216 or on a different circuit board, or device. For example, in some environments, storage device controller 1218 may be a centralized storage controller that manages memory operations for multiple different memories 1216 (which may each be of the same type of memory or may be of different types) of computer system 1200 (and thus may provide storage device controller functionality described herein to any of the memories to which it is coupled).

In various embodiments, the storage device 1206 also includes an address translation engine 1220. In the depicted embodiment, the address translation engine 1220 is shown as part of the storage device controller 1218, although in various embodiments, the address translation engine 1220 may be separate from the storage device controller 1218 and communicably coupled to the storage device controller 1218. In various embodiments, the address translation engine 1220 may be integrated on the same chip or package as the storage device controller 1218 or on a different chip or package.

In various embodiments, address translation engine 1220 may include logic to store and update a mapping between a logical address space (e.g., an address space visible to a host computing device coupled to the storage device 1206) and the physical address space of the memory 1216 of the storage device 1206 (which may or may not be exposed to the host computing device). The logical address space may expose a plurality of logical groups of data which are physically stored on corresponding physical groups of memory addressable through the physical address space of the storage device 1206. A physical address of the physical address space may comprise any suitable information identifying a physical memory location (e.g., a location within a memory array of a memory 1216) of the storage device 1206, such as an identifier of the memory 1216 on which the physical memory location is located, an identifier of the memory device 1222A on which the physical memory location is located, one or more pages of the physical memory location, one or more subblocks of the physical memory location, one or more wordlines of the physical memory location, one or more bitlines of the physical memory location, or other suitable identifiers or encodings thereof.

In various embodiments, the storage device 1206 also includes program control logic 1224 which is operable to control the programming sequence performed when data is written to a memory 1216 or the read sequence performed when data is read from a memory 1216. In various embodiments, program control logic 1224 may provide the various voltages (or information indicating which voltages should be provided) that are applied to one or more memory cells, word lines, bitlines, and/or other portions of a memory array during the programming and/or reading of data, perform error correction, and perform other suitable functions.

In various embodiments, the program control logic 1224 may be integrated on the same chip as the storage device controller 1218 or on a different chip. In the depicted embodiment, the program control logic 1224 is shown as part of the storage device controller 1218, although in various embodiments, all or a portion of the program control logic 1224 may be separate from the storage device controller 1218 and communicably coupled to the storage device controller 1218. For example, all or a portion of the program control logic 1224 may be located on the same package or chip as a memory 1216 and/or memory devices 1222A-D.

In some embodiments, all or some of the elements of system 1200 are resident on (or coupled to) the same circuit board (e.g., a motherboard). In various embodiments, any suitable partitioning between the elements may exist. For example, the elements depicted in CPU 1202 may be located on a single die (i.e., on-chip) or package or any of the elements of CPU 1202 may be located off-chip or off-package. Similarly, the elements depicted in storage device 1206 may be located on a single chip or on multiple chips. In various embodiments a storage device 1206 and a host computing device (e.g., CPU 1202) may be located on the same circuit board or on the same device and in other embodiments the storage device 1206 and the host computing device may be located on different circuit boards or devices.

The components of system 1200 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 1200, such as cores 1214, one or more CPU memory controllers 1212, I/O controller 1210, integrated I/O devices, direct memory access (DMA) logic (not shown), etc. In various embodiments, components of computer system 1200 may be coupled together through one or more networks comprising any number of intervening network nodes, such as routers, switches, or other computing devices. For example, a host computing device (e.g., CPU 1202) and the storage device 1206 may be communicably coupled through a network.

Although not depicted, system 1200 may use a battery and/or power supply outlet connector and associated system to receive power, a display to output data provided by CPU 1202, or a network interface allowing the CPU 1202 to communicate over a network. In various embodiments, the battery, power supply outlet connector, display, and/or network interface may be communicatively coupled to CPU 1202. Other sources of power can be used such as renewable energy (e.g., solar power or motion based power).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Logic may be used to implement any of the flows (e.g., the flows of FIG. 9 or FIG. 10) or functionality of any of the various components depicted throughout the figures, such as CPU 1202, storage device 1206, external I/O controller 1204, system memory device, one or more machine to manufacture chip 100, any subcomponent of these, or other component described herein. "Logic" may refer to hardware, firmware, software and/or combinations of each to perform one or more functions. As an example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one example, an apparatus comprising a tier comprising alternating first and second layers, wherein the first layers comprise a first conductive material and the second layers comprise a first dielectric material; a lower metal layer below the tier; a bond pad above the tier, the bond pad coupled to the lower metal layer by a via extending through the tier; and a first channel formed through a portion of the tier, the first channel surrounding the via, the first channel comprising a second dielectric material.

In an embodiment, the apparatus further comprises a second channel through a second portion of the tier, the second channel surrounding the via, the second channel comprising the second dielectric material. In an embodiment, the second channel surrounds the first channel. In an embodiment, the first channel is formed by applying a plurality of masks and etching to different depths of the tier with each applied mask, and the masks are also used to form channels for vias that each couple to a respective first layer of the tier. In an embodiment, the first channel is formed by applying a mask that is also used to form channels isolating memory array blocks from each other. In an embodiment, the width of the first channel at the bottom of the channel is between 3 and 5 microns. In an embodiment, the width of the first channel at any depth of the first channel is between 150 and 300 nanometers. In an embodiment, the first dielectric material and the second dielectric material both comprise silicon dioxide. In an embodiment, the second dielectric material comprises silicon dioxide. In an embodiment, at least a portion of a first layer of the tier forms at least a portion of a wordline of a NAND memory array.

In at least one embodiment, a method comprises forming a lower metal layer above a substrate; forming a tier comprising alternating first and second layers, wherein the first layers comprise a first conductive material and the second layers comprise a first dielectric material; and forming a first channel through a portion of the tier, the first channel to surround a via that is to couple the lower metal layer to a bond pad, the first channel comprising a second dielectric material.

In an embodiment, the method further comprises forming a second channel through a second portion of the tier, the second channel surrounding the via, the second channel comprising the second dielectric material. In an embodiment, the second channel surrounds the first channel. In an embodiment, the method further comprises forming the first channel by applying a plurality of masks and etching to different depths of the tier with each applied mask, wherein the masks are also used to form channels for vias that each couple to a respective first layer of the tier. In an embodiment, the method further comprises forming the first channel by applying a mask that is also used to form channels isolating memory array blocks from each other. In an embodiment, the width of the first channel at the bottom of the channel is between 3 and 5 microns. In an embodiment, the width of the first channel at any depth of the first channel is between 150 and 300 nanometers. In an embodiment, the first dielectric material and the second dielectric material both comprise silicon dioxide. In an embodiment, the second dielectric material comprises silicon dioxide. In an embodiment, at least a portion of a first layer of the tier forms at least a portion of a wordline of a NAND memory array.

In at least one embodiment, a system comprises a semiconductor package comprising a first input/output pin; and a first memory chip, the first memory chip comprising a tier comprising alternating first and second layers, wherein the first layers comprise a first conductive material and the second layers comprise a first dielectric material; a lower metal layer below the tier; a bond pad above the tier, the bond pad coupled to the lower metal layer by a via extending through the tier, the bond pad further coupled to the first input/output pin; and a first channel formed through a portion of the tier, the first channel surrounding the via, the first channel comprising a second dielectric material.

In an embodiment, the system further comprises a processor coupled to the first input/output pin. In an embodiment, the system further comprises one or more of: a battery communicatively coupled to the processor, a display communicatively coupled to the processor, or a network interface communicatively coupled to the processor. In an embodiment, the system further comprises a plurality of NAND memory cells formed within the tier. In an embodiment, the first memory chip further comprises a plurality of additional channels formed through portions of the tier, the plurality of additional channels each surrounding the via, the plurality of additional channels each comprising the second dielectric material.

In at least one embodiment, a system comprises means for forming a lower metal layer above a substrate; means for forming a tier comprising alternating first and second layers, wherein the first layers comprise a first conductive material and the second layers comprise a first dielectric material; and means for forming a first channel through a portion of the tier, the first channel to surround a via that is to couple the lower metal layer to a bond pad, the first channel comprising a second dielectric material.

In an embodiment, the system further comprises means for forming a second channel through a portion of the tier, the second channel to surround the via, the first channel comprising a second dielectric material. In an embodiment, the second channel surrounds the first channel. In an embodiment, the first channel is formed by applying a plurality of masks and etching to different depths of the tier with each applied mask, wherein the masks are also used to form channels for vias that each couple to a respective first layer of the tier. In an embodiment, the first channel is formed by applying a mask is also used to form channels isolating memory array blocks from each other.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a tier comprising alternating first and second layers, wherein the first layers comprise a first conductive material and the second layers comprise a first dielectric material;
   a lower metal layer below the tier;
   a bond pad above the tier, the bond pad coupled to the lower metal layer by a via extending through the tier; and
   a first channel formed through a portion of the tier, the first channel surrounding the via, the first channel comprising a second dielectric material; wherein the first channel has a plurality of different widths at different layers of the tier between a top and a bottom of the first channel, wherein a first width of the first channel is equal at each layer of a first set of adjacent first and second layers, wherein a second width of the first channel is equal at each layer of a second set of adjacent first and second layers, wherein the first width is different from the second width.

2. The apparatus of claim 1, further comprising a second channel through a second portion of the tier, the second channel surrounding the via, the second channel comprising the second dielectric material.

3. The apparatus of claim 2, wherein the second channel surrounds the first channel.

4. The apparatus of claim 3, wherein the second channel is coupled to the first channel via a conductive material.

5. The apparatus of claim 4, wherein the conductive material coupling the first channel to the second channel is located below the tier.

6. The apparatus of claim 1, wherein the width of the first channel increases monotonically from the bottom of the first channel to the top of the first channel.

7. The apparatus of claim 1, wherein the width of the first channel at the bottom of the first channel is between 3 and 5 microns.

8. The apparatus of claim 1, wherein the width of the first channel at any depth of the first channel is between 150 and 300 nanometers.

9. The apparatus of claim 1, wherein the first dielectric material and the second dielectric material both comprise silicon dioxide.

10. The apparatus of claim 1, wherein the second dielectric material comprises silicon dioxide.

11. The apparatus of claim 1, wherein at least a portion of a first layer of the tier forms at least a portion of a wordline of a NAND memory array.

12. A method comprising:
   forming a lower metal layer above a substrate;
   forming a tier comprising alternating first and second layers, wherein the first layers comprise a first conductive material and the second layers comprise a first dielectric material; and
   forming a first channel through a portion of the tier, the first channel to surround a via that is to couple the lower metal layer to a bond pad, the first channel comprising a second dielectric material; wherein the first channel has a plurality of different widths at different layers of the tier between a top and a bottom of the first channel, wherein a first width of the first channel is equal at each layer of a first set of adjacent first and second layers, wherein a second width of the first channel is equal at each layer of a second set of adjacent first and second layers, wherein the first width is different from the second width.

13. The method of claim 12, further comprising forming a second channel through a portion of the tier, the second channel to surround the via, the second channel comprising the second dielectric material.

14. The method of claim 13, wherein the second channel surrounds the first channel.

15. The method of claim 12, wherein the first channel is formed by applying a plurality of masks and etching to different depths of the tier with each applied mask, wherein the masks are also used to form channels for vias that each couple to a respective first layer of the tier, wherein a first mask of the plurality of masks causes etching of a first portion of the first channel to the first width and a second mask of the plurality of masks causes etching of a second portion of the first channel to the second width.

16. The method of claim 12, wherein the first channel is formed by applying a mask that is also used to form channels isolating memory array blocks from each other, wherein each of the memory array blocks include a plurality of memory cells to store data.

17. A system comprising:
a semiconductor package comprising:
  a first input/output pin; and
  a first memory chip, the first memory chip comprising:
    a tier comprising alternating first and second layers, wherein the first layers comprise a first conductive material and the second layers comprise a first dielectric material;
    a lower metal layer below the tier;
    a bond pad above the tier, the bond pad coupled to the lower metal layer by a via extending through the tier, the bond pad further coupled to the first input/output pin; and
    a first channel formed through a portion of the tier, the first channel surrounding the via, the first channel comprising a second dielectric material, wherein the first channel has a plurality of different widths at different layers of the tier between a top and a bottom of the first channel, wherein a first width of the first channel is equal at each layer of a first set of adjacent first and second layers, wherein a second width of the first channel is equal at each layer of a second set of adjacent first and second layers, wherein the first width is different from the second width; and
    a second channel formed through a second portion of the tier, the second channel surrounding the via, the second channel comprising the second dielectric material, wherein the second channel surrounds the first channel, wherein the second channel is separated from the first channel by a third portion of the tier comprising the alternating first and second layers.

18. The system of claim 17, further comprising a processor coupled to the first input/output pin.

19. The system of claim 18, further comprising one or more of: a battery communicatively coupled to the processor, a display communicatively coupled to the processor, or a network interface communicatively coupled to the processor.

20. The system of claim 17, further comprising a plurality of NAND memory cells formed within the tier.

21. The system of claim 17, wherein the first memory chip further comprises a plurality of additional channels formed through portions of the tier, the plurality of additional channels each surrounding the via, the plurality of additional channels each comprising the second dielectric material.

22. The system of claim 17, further comprising a third channel formed through a fourth portion of the tier, the third channel surrounding the via, the third channel comprising the second dielectric material, wherein the third channel surrounds the first channel and second channel, wherein the third channel is separated from the second channel by a fifth portion of the tier comprising the alternating first and second layers.

* * * * *